US008927060B2

(12) United States Patent
Kawano et al.

(10) Patent No.: US 8,927,060 B2
(45) Date of Patent: Jan. 6, 2015

(54) METHOD FOR FORMING GE-SB-TE FILM AND STORAGE MEDIUM

(75) Inventors: Yumiko Kawano, Yamanashi (JP); Susumu Arima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/377,199

(22) PCT Filed: Jun. 2, 2010

(86) PCT No.: PCT/JP2010/059338
§ 371 (c)(1), (2), (4) Date: Jan. 3, 2012

(87) PCT Pub. No.: WO2010/143571
PCT Pub. Date: Dec. 16, 2010

(65) Prior Publication Data

US 2012/0107505 A1 May 3, 2012

(30) Foreign Application Priority Data

Jun. 11, 2009 (JP) ................................ 2009-139928

(51) Int. Cl.

| | |
|---|---|
| ***C23C 16/00*** | (2006.01) |
| ***C23C 16/06*** | (2006.01) |
| ***H01L 45/00*** | (2006.01) |
| ***C23C 16/30*** | (2006.01) |
| ***G11B 7/2433*** | (2013.01) |
| *G11B 7/26* | (2006.01) |
| *G11B 7/243* | (2013.01) |

(52) U.S. Cl.
CPC ............ *H01L 45/144* (2013.01); *C23C 16/305* (2013.01); *G11B 7/2433* (2013.01); *H01L 45/06* (2013.01); *H01L 45/1616* (2013.01); *G11B 7/266* (2013.01); *G11B 2007/24312* (2013.01); *G11B 2007/24314* (2013.01); *G11B 2007/24316* (2013.01)
USPC ................ 427/255.32; 427/248.1; 427/255.3; 427/255.29; 427/255.28; 427/255.23

(58) Field of Classification Search
USPC ............... 427/255.32, 248.1, 255.31, 255.29, 427/255.28, 255.23
See application file for complete search history.

(56) References Cited

U.S. PATENT DOCUMENTS

2006/0172067 A1* 8/2006 Ovshinsky et al. ........ 427/248.1
2007/0048977 A1* 3/2007 Lee et al. ...................... 438/483

(Continued)

FOREIGN PATENT DOCUMENTS

JP 2006-128370 A 5/2006
JP 2007-056369 A 3/2007

(Continued)

OTHER PUBLICATIONS

International Search Report for PCT/JP2010/059338 dated Jul. 6, 2010.

*Primary Examiner* — Kelly M Gambetta
(74) *Attorney, Agent, or Firm* — Pearne & Gordon LLP

(57) ABSTRACT

There is provided a method for forming a Ge—Sb—Te film having a composition of $Ge_2Sb_2Te_5$ on a substrate by a CVD method using a gaseous Ge source material, a gaseous Sb source material and a gaseous Te source material. The method includes loading the substrate within a processing chamber (Process 1); performing a first stage film forming process on the substrate by supplying the gaseous Ge source material and the gaseous Sb source material (Process 2); and performing a second stage film forming process on a film obtained through the first stage film forming process by supplying the gaseous Sb source material and the gaseous Te source material (Process 3). The Ge—Sb—Te film is formed by the film obtained through Process 2 and by a film obtained through Process 3.

11 Claims, 7 Drawing Sheets

(56) References Cited

U.S. PATENT DOCUMENTS

2007/0204147 A1 8/2007 Kobayashi et al.
2008/0286446 A1* 11/2008 Kamepalli et al. ........... 427/97.2

FOREIGN PATENT DOCUMENTS

JP 2007056369 A * 3/2007
JP 2008-103731 A 5/2008

* cited by examiner

×10K ×50K ×100K

METHOD FOR FORMING GE-SB-TE FILM AND STORAGE MEDIUM

TECHNICAL FIELD

The present disclosure relates to a method for forming a Ge—Sb—Te film by a CVD method and also relates to a storage medium storing a program for implementing the method for forming a Ge—Sb—Te film.

BACKGROUND ART

Recently, attention has been drawn to a PRAM (Phase-change Random Access Memory) for storing information therein by using a phase-change film as a high-speed non-volatile memory having a long lifetime. The phase-changing film is made of a material that becomes amorphous state with a high resistance value by being rapidly cooled after being heated to a high temperature (e.g., about 600° C. or higher), and also becomes crystalline with an ordinary resistance value by being gradually cooled after being heated to a relatively low temperature (e.g., about 400° C. or higher). The PRAM stores data therein by using a difference between the resistance values of these two phases. Such a phase change may be made by controlling a magnitude of a current pulse. That is, by flowing a current having a large pulse, the amorphous state may be obtained, whereas by flowing a current having a small pulse, the crystalline state may be obtained.

$Ge_2Sb_2Te_5$ serving as a Ge—Sb—Te film, has been used as a material for forming such a phase-change film in the PRAM. Generally, the Ge—Sb—Te film is formed by a PVD method such as sputtering. Since, however, a sufficient step coverage cannot be obtained by the PVD method, it has been attempted to form the phase-change film by a CVD method in order to obtain a good step coverage.

However, it has been found out that a Ge—Sb—Te film may have a poor surface smoothness when the Ge—Sb—Te film is formed by the CVD method using a Ge compound, a Sb compound, and a Te compound as source materials for the film formation.

DISCLOSURE OF THE INVENTION

In view of the foregoing problem, the present disclosure provides a method for forming a Ge—Sb—Te film having a good surface smoothness by a CVD method.

The present disclosure also provides a storage medium storing a program for implementing the method for forming a Ge—Sb—Te film.

The inventors of the present disclosure have found out that when a Ge—Sb—Te film having a composition of $Ge_2Sb_2Te_5$ is formed by a CVD method using a gaseous Ge source material, a gaseous Sb source material, and a gaseous Te source material, if those materials are supplied at the same time, crystal grains having a strong crystal habit would be sparsely formed so that the Ge—Sb—Te film may have a poor surface smoothness. However, the inventors have also found out that films formed by performing a two stage process can be unified so that a Ge—Sb—Te film having a good surface smoothness can be formed. At this time, in a first stage, a first film formation is performed by using the gaseous Ge source material and the gaseous Sb source material. Alternatively, the first film is formed by using the gaseous Ge source material, the gaseous Sb source material and a small amount of a gaseous Te source material that cannot form the $Ge_2Sb_2Te_5$ film. Then, in a second stage, a second film is formed by using the gaseous Sb material and the gaseous Te material. Alternatively, the second film is formed by using the gaseous Sb material, the gaseous Te material and a small amount of the gaseous Ge source material that cannot form the $Ge_2Sb_2Te_5$ film.

In accordance with one aspect of the present disclosure, there is provided a method for forming a Ge—Sb—Te film having a composition of $Ge_2Sb_2Te_5$ on a substrate by a CVD method using a gaseous Ge source material, a gaseous Sb source material and a gaseous Te source material. The method includes loading the substrate within a processing chamber; performing a first stage process on the substrate by supplying the gaseous Ge source material and the gaseous Sb source material, or by supplying the gaseous Ge source material, the gaseous Sb source material and a small amount of the gaseous Te source material that cannot form $Ge_2Sb_2Te_5$; and performing a second stage process on a film obtained through the first stage process by supplying the gaseous Sb source material and the gaseous Te source material, or by supplying the gaseous Sb source material, the gaseous Te source material and a small amount of the gaseous Ge source material that cannot form $Ge_2Sb_2Te_5$. Here, the Ge—Sb—Te film is formed by the film obtained through the first stage process and by a film obtained through the second stage process.

In accordance with another aspect of the present disclosure, there is provided a computer-readable storage medium having stored thereon computer-executable instructions that, in response to execution, cause a film forming apparatus to perform a method for forming a Ge—Sb—Te film having a composition of $Ge_2Sb_2Te_5$ on a substrate by a CVD method using a gaseous Ge source material, a gaseous Sb source material and a gaseous Te source material. The method includes loading the substrate within a processing chamber; performing a first stage process on the substrate by supplying the gaseous Ge source material and the gaseous Sb source material, or by supplying the gaseous Ge source material, the gaseous Sb source material and a small amount of the gaseous Te source material that cannot form $Ge_2Sb_2Te_5$; and performing a second stage process on a film obtained through the first stage process by supplying the gaseous Sb source material and the gaseous Te source material, or by supplying the gaseous Sb source material, the gaseous Te source material and a small amount of the gaseous Ge source material that cannot form $Ge_2Sb_2Te_5$. Here, the Ge—Sb—Te film is formed by the film obtained through the first stage process and by a film obtained through the second stage process.

BEST MODE FOR CARRYING OUT THE INVENTION

Hereinafter, embodiments of the present disclosure will be described with reference to the accompanying drawings. Here, the embodiments will be described for a case of forming a Ge—Sb—Te film as a phase-change film of a PRAM on a semiconductor wafer.

Further, in the following description, although mL/min is typically used as a unit of a gas flow rate, a converted value under a standard condition is used in the present disclosure since a volume of a gas may greatly vary depending on a temperature and a pressure. A flow rate converted to a value under a standard condition is generally expressed by the term of "sccm" (Standard Cubic Centimeter per Minutes). Accordingly, the "sccm" is also used in the present disclosure. Here, the standard condition refers to a state in which the temperature of the gas is about 0° C. (273.15 K) and the pressure of the gas is about 1 atm (101325 Pa).

Figure 1:
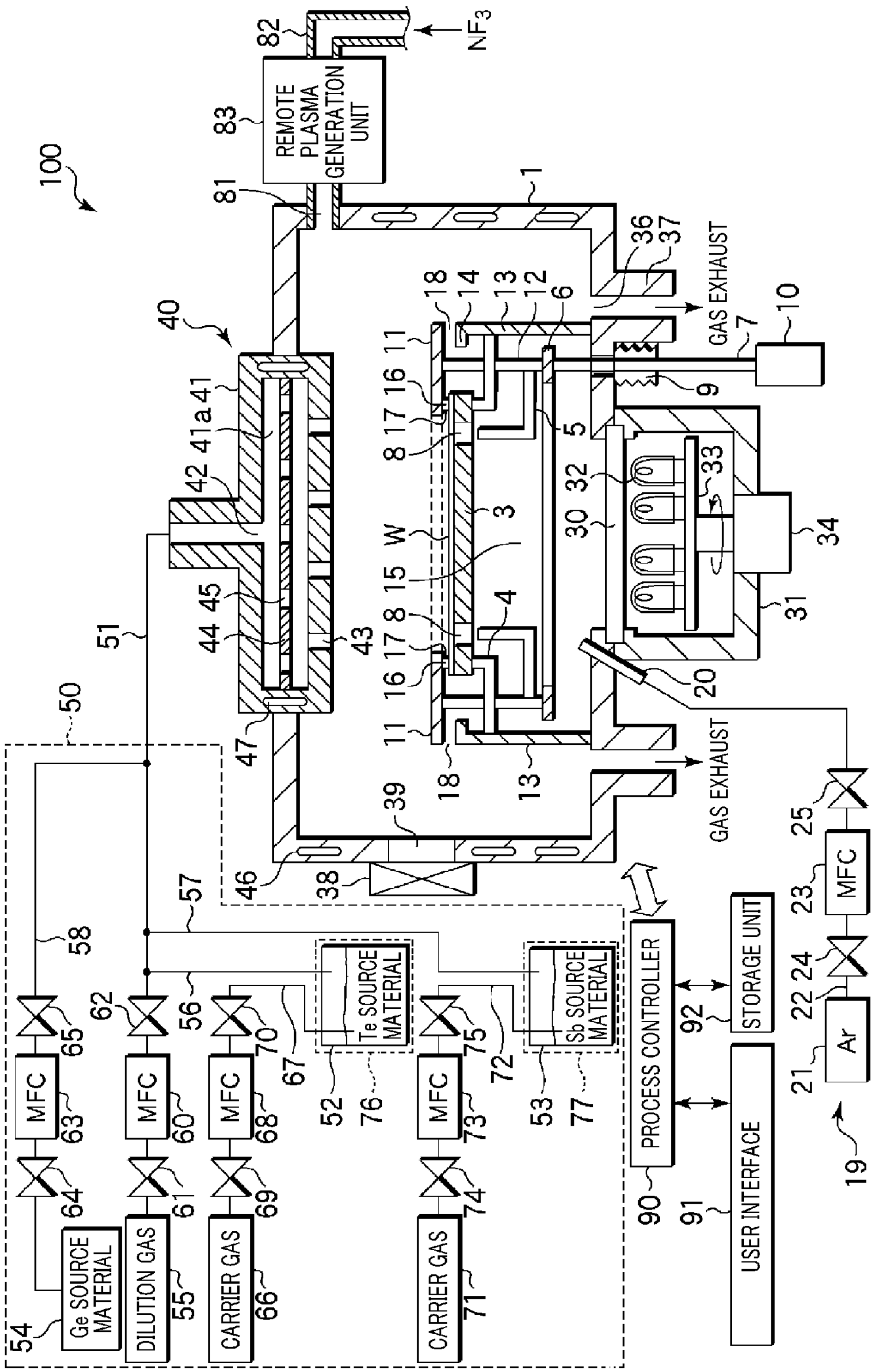
FIG. 1 is a cross sectional view schematically illustrating a configuration of a film forming apparatus that can be used in performing a film forming method for a Ge—Sb—Te film in accordance with the present disclosure.

FIG. 1 is a cross sectional view illustrating a schematic configuration of a film forming apparatus that can be used to perform a method for a Ge—Sb—Te film in accordance with the present disclosure. The film forming apparatus 100 shown in FIG. 1 may include a cylinder-shaped or box-shaped processing chamber 1 made of, e.g., aluminum. A mounting table 3 for mounting thereon a semiconductor wafer W (hereinafter, simply referred to as a "wafer") serving as a target substrate to be processed may be provided within the processing chamber 1. By way of non-limiting example, the mounting table 3 may be made of a carbon material such as a graphite plate, a graphite plate covered with SiC, or ceramics such as aluminum nitride having high heat conductivity.

A cylindrical partition wall 13 made of, e.g., aluminum, may uprightly stand on a bottom portion of the processing chamber 1 at an outer periphery side of the mounting table 3. A top end of the partition wall 13 may be horizontally bent in, e.g., an L-shape to form a bent portion 14. By providing the cylindrical partition wall 13 in this way, an inert gas purge room 15 is formed at a rear surface side of the mounting table 3. A top surface of the bent portion 14 may be positioned substantially on a same plane with a top surface of the mounting table 3. The bent portion 14 may be spaced apart from an outer periphery of the mounting table 3. Further, connection rods 12 may be inserted through a gap between the bent portion 14 and the mounting table 3. The mounting table 3 may be supported by three supporting arms 4 (only two are depicted in the shown example) extended from an upper inner wall of the partition wall 13.

Provided under the mounting table 3 are, e.g., three L-shaped lifter pins 5 (only two are depicted in the shown example). The lifter pins 5 may be upwardly provided from a ring-shaped supporting member 6. The supporting member 6 may be configured to be moved up and down by an elevation rod 7 passing through a bottom portion of the processing chamber 1. The elevation rod 7 may be moved up and down by an actuator 10 that is positioned below the processing chamber 1. Further, insertion through holes 8 may be formed through the mounting table 3 at respective positions corresponding to the lifter pins 5. By moving up the lifter pins 5 by the actuator 10 through the elevation rod 7 and the supporting member 6, the lifter pins 5 may pass through the insertion through holes 8 so as to lift the wafer W. A portion of the processing chamber 1 into which the elevation rod 7 is inserted is covered with a bellows 9. Thus, an exterior air can be prevented from entering the processing chamber 1 through that portion.

A clamp ring member 11 is provided above a periphery of the mounting table 3 so as to hold and fix the periphery portion of the wafer W on the mounting table 3. The clamp ring member 11 may have a substantially ring shape conforming to a contour shape of the wafer W. The clamp ring member 11 may be made of, but not limited to, ceramic such as aluminum nitride. The clamp ring member 11 is connected with the supporting member 6 via the connection rods 12. The clamp ring member 11 may be moved up and down together with the lifter pins 5. The lifter pins 5 or the connection rods 12 may be made of ceramic such as alumina.

A multiple number of contact protrusions 16 are formed below a bottom surface of an inner periphery side of the ring-shaped clamp ring member 11. The contact protrusions 16 are spaced from each other at a substantially regular interval along the circumference of the clamp ring-member 11. When the clamp ring member 11 clamps the wafer W, bottom surfaces of the contact protrusions 16 may come into contact with a top surface of the periphery portion of the wafer W and press the wafer W. A diameter and a height of each contact protrusion 16 may be set to be about 1 mm and about 50 μm, respectively. When the wafer W is clamped, a ring-shaped first gas purge gap 17 is formed at a vicinity of the contact protrusions 16. Further, during the clamping, an overlapped amount (a passage length of the first gas purge gap 17) between the periphery portion of the wafer W and the inner periphery portion of clamp ring member 11 may be about several millimeters (mm).

An outer periphery portion of the clamp ring member 11 is positioned above the bent portion 14 of the partition wall 13, and a ring-shaped second gas purge gap 18 is formed therebetween. A width (height) of the second gas purge gap 18 may be, e.g., about 500 μm, which is about 10 times larger than that of the first gas purge gap 17. An overlapped amount between the outer periphery portion of the clamp ring member 11 and the bent portion 14 (i.e., a passage length of the second gas purge gap 18) may be, e.g., about 10 mm. In this configuration, inert gases within the inert gas purge room 15 can be discharged into a processing space through the gaps 17 and 18.

Provided below the bottom portion of the processing chamber 1 is an inert gas supply unit 19 configured to supply an inert gas into the inert gas purge room 15. The inert gas supply unit 19 may include a gas nozzle 20 for introducing the inert gas, e.g., an Ar gas (backside Ar gas) into the inert gas purge room 15; an Ar gas supply source 21 for supplying the Ar gas serving as the inert gas; a gas line 22 for guiding the Ar gas from the Ar gas supply source into the gas nozzle 20. Further, the gas line 22 is provided with opening/closing valves 24 and 25, and a mass flow controller 23 serving as a flow rate controller. As the inert gas, another kind of rare gas such as a He gas may be used instead of the Ar gas.

A transmission window 30 made of a heat-ray transmitting material such as quartz is airtightly provided at a position right under the mounting table 3 at the bottom portion of the processing chamber 1. Further, a box-shaped heating room 31 is provided under the transmission window 30 so as to surround the transmission window 30. Within the heating room 31, a multiple number of heating lamps 32 serving as a heating device are mounted on a rotary table 33. The rotary table 33 may also serve as a reflection mirror. The rotary table 33 may be rotated by a rotating motor 34 provided at a bottom portion of the heating room 31 through a rotation shaft. Heat rays emitted from the heating lamps may be irradiated to the rear surface of the mounting table 3 through the transmission window 30 to thereby heat the mounting table 3.

Further, a gas exhaust port 36 is formed at a peripheral bottom portion of the processing chamber 1. The gas exhaust port 36 is connected with a gas exhaust line 37 which is connected with a non-illustrated vacuum pump. By evacuating the processing chamber 1 through the gas exhaust port 36 and the gas exhaust line 37, the interior of the processing chamber 1 can be maintained at a certain vacuum level. Further, a loading/unloading port 39 through which the wafer W is loaded into and unloaded from the processing chamber 1 and a gate valve 38 for opening/closing the loading/unloading port 39 are provided at a sidewall of the processing chamber 1.

Furthermore, a shower head 40 for introducing a source gas or the like into the processing chamber 1 is provided at a ceiling portion of the processing chamber 1 so as to face the mounting table 3. The shower head 40 may be made of, but not limited to, aluminum and have a head main body 41 of a circular disk shape. The head main body 41 may have a space 41*a* therein. Further, a gas inlet port 42 is provided at a ceiling portion of the head main body 41. A processing gas supply unit 50 for supplying processing gases required for forming a Ge—Sb—Te film is connected to the gas inlet port 42 through a pipeline 51. A multiple number of gas discharge holes 43 for discharging the gas supplied into the head main body 41 into the processing space within the processing chamber 1 are uniformly formed over the entire bottom surface (wafer facing surface) of the head main body 41. Through the gas discharge holes 43, the gas can be discharged toward the entire surface of the wafer W. Further, a diffusion plate 44 having a multiple number of gas diffusion holes 45 is provided within the space 41*a* of the head main body 41, so that it is possible to supply the gas to the surface of the wafer W more uniformly. Moreover, cartridge heaters 46 and 47 for temperature control are provided in sidewalls of the processing chamber 1, sidewalls of the shower head 40, and the wafer facing surface of the shower head 40 where the gas discharge holes 43 are provided. With the cartridge heaters 46 and 47, the sidewalls of the processing chamber 1 and the shower head 40 to be in contact with the source gas can be maintained at a certain temperatures.

The processing gas supply unit 50 may include a Te source material reservoir 52 for storing a Te source material therein; a Sb source material reservoir 53 for storing a Sb source material therein; a Ge source material reservoir 54 for storing a Ge source material therein; and a dilution gas supply source 55 for supplying a dilution gas such as an argon gas for diluting the gas within the processing chamber 1. Further, the processing gas supply unit 50 may be capable of further supplying a $NH_3$ gas and/or a $H_2$ gas serving as an additive gas for improving a film quality.

The pipeline 51 connected to the shower head 40 is connected with a pipeline 56 extended from the Te source material reservoir 52, a pipeline 57 extended from the Sb source material reservoir 53 and a pipeline 58 extended from the Ge source material reservoir 54. Further, the pipeline 51 is also connected with the dilution gas supply source 55. The pipeline 51 is provided with a mass flow controller (MFC) 60 serving as a flow rate controller, and opening/closing valves 61 and 62 provided at upstream and downstream sides of the mass flow controller (MFC) 60. The pipeline 58 is provided with a mass flow controller (MFC) 63 serving as a flow rate controller, and opening/closing valves 64 and 65 provided at upstream and downstream sides of the mass flow controller (MFC) 63.

A carrier gas supply source 66 for supplying a carrier gas for bubbling, e.g., Ar gas or the like, is connected to the Te source material reservoir 52 via a pipeline 67. The pipeline 67 is provided with a mass flow controller (MFC) 68 serving as a flow rate controller, and opening/closing valves 69 and 70 provided at upstream and downstream sides of the mass flow controller (MFC) 68. Further, a carrier gas supply source 71 for supplying a carrier gas such as Ar gas or the like is connected to the Sb source material reservoir 53 via a pipeline 72. The pipe line 72 is provided with a mass flow controller (MFC) 73 serving as a flow rate controller, and opening/closing valves 74 and 75 provided at upstream and downstream sides of the mass flow controller (MFC) 73. Heaters 76 and 77 are provided at the Te source material reservoir 52 and the Sb source material reservoir 53, respectively. The Te source material stored in the Te source material reservoir 52 and the Sb source material stored in the Sb source material reservoir 53 are supplied into the processing chamber 1 through bubbling while being heated by the heaters 76 and 77. Further, the Ge source material stored in the Ge source material reservoir 54 is supplied into the processing chamber 1 while its flow rate is controlled by the mass flow controller (MFC) 63. Though not shown, heaters may also be provided at the pipelines for supplying the Ge source material, the Sb source material, the Te source material in a vaporized state or at the mass flow controllers.

Further, in accordance with the present embodiment, the Ge source material is supplied by using the mass flow controller while supplying the Sb source material and the Te source material by bubbling. However, it may be also possible to supply the Ge source material by bubbling and to supply the Sb source material and the Te source material by the mass flow controller. Further, it may be also possible to vaporize a liquid source material by a vaporizer and then to supply the source material in a vaporized state while controlling a flow rate of the liquid source material by a mass flow controller.

The Ge source material, the Sb source material and the Te source material may be compounds that can be supplied in a gaseous phase. It may be desirable to use a compound having a high vapor pressure since it is easy to vaporize such a compound. By way of example, a compound including an alkyl group may be appropriately used since such a compound has a high vapor pressure and is of a low price. However, in accordance with the present disclosure, the source materials may not be limited to the compound including the alkyl group.

Specifically, the Ge source material containing an alkyl group may include, for example, methyl germanium [$Ge(CH_3)H_3$], tertiary-butyl germanium [$Ge((CH_3)_3C)H_3$], tetra-methyl germanium [$Ge(CH_3)_4$], tetra-ethyl germanium [$Ge(C_2H_5)_4$], tetra-dimethyl amino germanium [$Ge((CH_3)_2N)_4$], or the like. The Sb source material containing an alkyl group may include, for example, triisopropyl antimony [$Sb(i\text{-}C_3H_7)_3$], tri-methyl antimony [$Sb(CH_3)_3$], trisdimethyl antimony [$Sb((CH_3)_2N)_3$], or the like. The Te source material containing an alkyl group may include, for example, diisopropyl tellurium [$Te(i\text{-}C_3H_7)_2$], ditertiary-butyl tellurium [$Te(t\text{-}C_4H_9)_2$], diethyl tellurium [$Te(C_2H_5)_2$], or the like.

A cleaning gas inlet port 81 for introducing a $NF_3$ gas serving as a cleaning gas is formed at an upper portion of a sidewall of the processing chamber 1. A pipeline 82 for supplying the $NF_3$ gas is connected to the cleaning gas inlet port 81. A remote plasma generation unit 83 is provided on the pipeline 82. The $NF_3$ gas supplied through the pipeline 82 is converted into plasma. Subsequently, the plasma is supplied into the processing chamber 1 so as to clean the interior of the processing chamber 1. Further, it may also be possible to arrange the remote plasma generation unit 83 right above the shower head 40 and to supply a cleaning gas through the shower head 40. Moreover, $F_2$ can be used instead of the $NF_3$.

Further, a plasma-less thermal clean using $ClF_3$ or the like can be performed without using a remote plasma.

The film forming apparatus 100 may include a process controller 90 having a microprocessor (computer). Components of the film forming apparatus 100 may be connected to and controlled by the process controller 90. Further, connected to the process controller 90 is a user interface 91 including a keyboard through which an operator inputs commands for controlling each component of the film forming apparatus 100, and a display for visually displaying an operation status of each component of the film forming apparatus 100. Moreover, also connected to the process controller 90 is a storage unit 92 for storing therein control programs to be used in implementing a certain process performed by the film forming apparatus 100 under the control of the process controller 90, programs, i.e., recipes to be used in performing a certain process by each component of the film forming apparatus 100 under a processing condition, various database, or the like. The recipes may be stored in a storage medium (not shown) in the storage unit 92. The storage medium can be a fixed device such as a hard disk, or a portable device such as a CD-ROM, a DVD, a flash memory or the like. Further, the recipe may be appropriately transmitted from another apparatus via, e.g., a dedicated line.

If necessary, any one of the recipes may be read out from the storage unit 92 in response to an instruction inputted from the user interface 91 and executed by the process controller 90. Accordingly, a desired process is performed in the film forming apparatus 100 under the control of the process controller 90.

Figure 2:
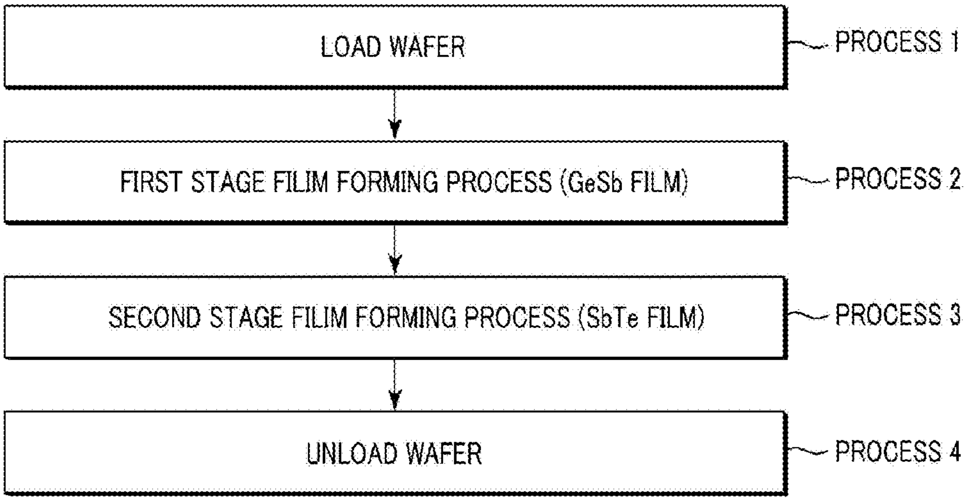
FIG. 2 is a flowchart for describing the film forming method in accordance with the present disclosure.

Now, an embodiment of a film forming method performed by the film forming apparatus having the above-described configuration will be described with reference to a flowchart of FIG. 2.

First, the gate valve 38 is opened. Then, a wafer W is loaded into the processing chamber 1 through the loading/unloading port 39 and is mounted on the mounting table 3 (Process 1). Then, the gate valve 38 is closed and the inside of the processing chamber 1 is evacuated to a certain vacuum level. The mounting table 3 is heated in advance by heat rays emitted from the heating lamps 32 and transmitted through the transmission window 30. Then, the wafer W is heated by the heat of the mounting table 3.

Then, a first stage process for forming a GeSb film or a GeSbTe film containing a small amount of Te on the wafer W is performed by flowing a Ge source material gas and a Sb source material gas at certain flow rates while stopping a supply of the Te source material gas or flowing just a small amount of Te source material gas (Process 2). In this first stage process, while supplying a dilution gas, e.g., an Ar gas from the dilution gas supply source 55 at a flow rate ranging from about 100 mL/sec (sccm) to about 500 mL/sec (sccm), the interior of the processing chamber 1 is evacuated by a vacuum pump (not shown) through the gas exhaust port 36 and the gas exhaust line 37, so that a pressure within the processing chamber 1 is controlled to be, e.g., about 60 Pa to about 1330 Pa. At this time, a heating temperature of the wafer W may be set to be, e.g., about 200° C. to about 600° C. and, desirably, about 300° C. to about 400° C.

Then, the flow rate of the dilution gas, e.g., the Ar gas is set to be about 200 mL/sec (sccm) to about 1000 mL/sec (sccm), and the pressure within the processing chamber 1 is controlled to be within in a range from about 60 Pa to about 6650 Pa, to start an actual film formation. Further, the pressure within the processing chamber 1 is controlled by an automatic pressure controller (APC) (not shown) provided on the gas exhaust line 37.

In this state, the Sb source material gas is introduced through bubbling into the processing chamber 1 from the Sb source material reservoir 53 by flowing, e.g., a carrier gas at a certain flow rate. Further, the Ge source material gas of a certain flow rate is also introduced into the processing chamber 1 from the Ge source material reservoir 54 by the mass flow controller (MFC) 63. In addition, a small amount of the Te source material gas may also be introduced through bubbling into the processing chamber 1 from the Te source material reservoir 52 by flowing, e.g., a carrier gas at a certain flow rate. Accordingly, a GeSb film or a GeSbTe film containing the small amount of Te is formed. At this time, the GeSb film or the GeSbTe film containing the small amount of Te may have a good surface smoothness.

As performed conventionally, if the Ge source material gas, the Sb source material gas, and the Te source material gas are simultaneously introduced into the processing chamber 1 at flow rates capable of forming $Ge_2Sb_2Te_5$, crystal grains having a strong crystal habit are sparsely formed on the wafer W. As a result, a film having a poor surface smoothness is formed. In contrast, regarding the GeSb film without containing Te or the GeSbTe film containing a small amount of Te, this film may have a good surface smoothness since crystal grains having strong crystal habit are hardly formed.

When introducing the Te source material in the first stage process as Process 2, a small amount of the Te source material can be allowed as long as it cannot form $Ge_2Sb_2Te_5$. Specifically, when adding the Te, a Te content of the obtained film needs to be less than about 10 at %. Hence, the Te source material gas is supplied such that the Te content is less than the above amount. Further, it is desirable to set a composition ratio Ge/Sb between Ge and Sb to be about 50/50 to about 70/30 based on an atom number ratio. Moreover, when a flow rate of the Ge source material ($N_2$ standard) is x (mL/min (sccm)) and a flow rate of a carrier Ar gas of the Sb source material is y (mL/min (sccm)), it is desirable to set y/x to be about 0.01 to about 0.1. Further, it is desirable to control a flow rate ratio of the Ge source material gas and the Sb source material gas such that the composition ratio becomes within such a range. If y/x is larger than 0.1 or if Ge/Sb (atom number ratio) of the film is smaller than 1.0, the surface smoothness of the film may be deteriorated. Further, if y/x is smaller than 0.01 or if Ge/Sb (atom number ratio) of the film is larger than 2.5, a film forming rate may be reduced remarkably. Meanwhile, the flow rate of the Ge source material ($N_2$ standard) is a measurement value obtained when the flow rate of the Ge source material is measured by a mass flow controller corrected for $N_2$ gas.

When the first stage process as Process 2 is finished, a second stage process for forming a SbTe film or a GeSbTe film containing a small amount of Ge on the film formed in the first stage process is performed by flowing the Sb source material gas and the Te source material gas at certain flow rates while stopping a supply of the Ge source material gas or flowing just a small amount of Ge source material gas (Process 3). Accordingly, the films formed in the first stage and the second stage are unified, so that a stable Ge—Sb—Te film having a good surface smoothness and having a composition of $Ge_2Sb_2Te_5$ is formed.

In the second stage process, the Sb source material gas, the Te source material gas, and the Ge source material gas are supplied in the same way as in the first stage process. Further, in the second stage process, the Sb source material gas and the Te source material gas, or the Sb source material gas, the Te source material gas and a small amount of the Ge source material may be flown at a flow rate ratio capable of stably obtaining $Ge_2Sb_2Te_5$ by the first stage and second stage processes. At this time, there is no special limit in a composition ratio Sb/Te between Sb and Te if a flow rate ratio therebetween is capable of stably obtaining $Ge_2Sb_2Te_5$ by the first stage and second stage processes. However, a composition of the film finally obtained after the first stage and second stage processes may be varied depending on a flow rate ratio and a flowing time of the Sb source material, the Te source material, and, if used, a small amount of Ge source material even if the film obtained in the first stage is the same. When a flow rate of the Ge source material is x (mL/min (sccm)), a flow rate of a carrier Ar gas of the Sb source material is y (mL/min (sccm)) and a flow rate of a carrier Ar gas of the Te source material is z (mL/min (sccm)), $Ge_{26}Sb_{26}Te_{48}$ may be obtained if the source materials are flown at a condition of y=20 (sccm) and z=50 (mL/min (sccm)) for about 30 seconds, and $Ge_{31}Sb_{32}Te_{36}$ may be obtained if the source materials are flown at the same conditions for about 15 seconds. Further, in only the second stage process, if the source materials are flown for about 30 seconds at a source material ratio among Ge, Sb, and Te capable of obtaining $Ge_2Sb_2Te_5$ or if the source materials are flown at a condition of x=550 (mL/min (sccm)), y=20 (mL/min (sccm)), z=50 (mL/min (sccm)), $Ge_{34}Sb_{32}Te_{34}$ may be obtained. Moreover, in the second stage process, if only the Te source material is supplied, the film without containing Te or the film containing the small amount of Te, which was previously formed in the first stage, may be etched and a reaction product having a composition of $Ge_2Sb_2Te_5$ may become a gas and be removed. As a result, a film having a poor surface smoothness may be formed.

In these first stage and second stage processes, it is desirable to examine the flow rate ratios of the source materials in advance so as to form a Ge—Sb—Te film having a desired composition depending on the source materials to be used.

After the second stage process as Process 3 is finished, the supply of the source materials is stopped; the interior of the processing chamber 1 is purged by the dilution gas; the gate valve 38 is opened; and the wafer W having thereon a film is unloaded from the processing chamber (Process 4). In this way, the film forming process on a single sheet of wafer is completed.

In accordance with the present embodiment as described above, a film is formed in the first stage by using the gaseous Ge source material and the gaseous Sb source material or, by using the gaseous Ge source material, the gaseous Sb source material and a small amount of the gaseous Te source material that cannot form $Ge_2Sb_2Te_5$. Then, in the second stage, a film is formed by using the gaseous Sb source material and the gaseous Te source material or, by using the gaseous Sb source material, the gaseous Te source material and a small amount of the Ge source material that cannot form $Ge_2Sb_2Te_5$. Hence, a Ge—Sb—Te film that becomes $Ge_2Sb_2Te_5$ can be formed without generating crystals having strong crystal habit. As a result, it is possible to form the Ge—Sb—Te film having a good surface smoothness.

Hereinafter, results of experiments for actually forming a Ge—Sb—Te film will be described.

<Experiment 1>

In the film forming apparatus shown in FIG. 1, the temperature of the wall of the processing chamber is set to be about 160° C. by the cartridge heaters and the temperature of the mounting table is set to be about 360° C. by controlling a lamp power. Then, a circular disk-shaped wafer having a diameter of about 200 mm is loaded into the processing chamber by an arm of a transfer robot to form Ge—Sb—Te film. Further, tertiary-butyl germanium, triisopropyl antimony, and diisopropyl tellurium are used as a Ge source material, a Sb source material, and a Te source material, respectively. The tertiary-butyl germanium is supplied into the processing chamber by directly controlling a vapor flow rate through a mass flow controller provided at a back end of a source material reservoir maintained at a room temperature. The triisopropyl antimony is supplied into the processing chamber through a bubbling in which an Ar gas, serving as a carrier gas, having a controlled flow rate is flown into a source material reservoir whose temperature is controlled to be about 50° C. The diisopropyl tellurium is supplied into the processing chamber by a bubbling in which an Ar gas, serving as a carrier gas, having a controlled flow rate is flown into a source material reservoir whose temperature is controlled to be about 35° C. At this time, the saturated vapor pressure of the triisopropyl antimony is about 266 Pa, and the saturated vapor pressure of the diisopropyl tellurimum is about 905 Pa. Further, the temperature of pipelines from the mass flow controllers and the source material reservoirs to the processing chamber are maintained at about 160° C. by mantle heaters.

Then, a Ge—Sb—Te-based film is formed under the following conditions.

Mounting table temperature: 360° C.

Pressure within the processing chamber: 665 Pa

Flow rate of Ge source material gas: 550 mL/min (sccm): $N_2$ standard

Flow rate of Sb carrier Ar gas: 20 mL/min (sccm)

Flow rate of Te carrier Ar gas: 50 mL/min (sccm)

Flow rate of dilution Ar gas: 100 mL/min (sccm)

Flow rate of backside Ar gas: 200 mL/min (sccm)

Film forming time: 90 sec

Figure 3:
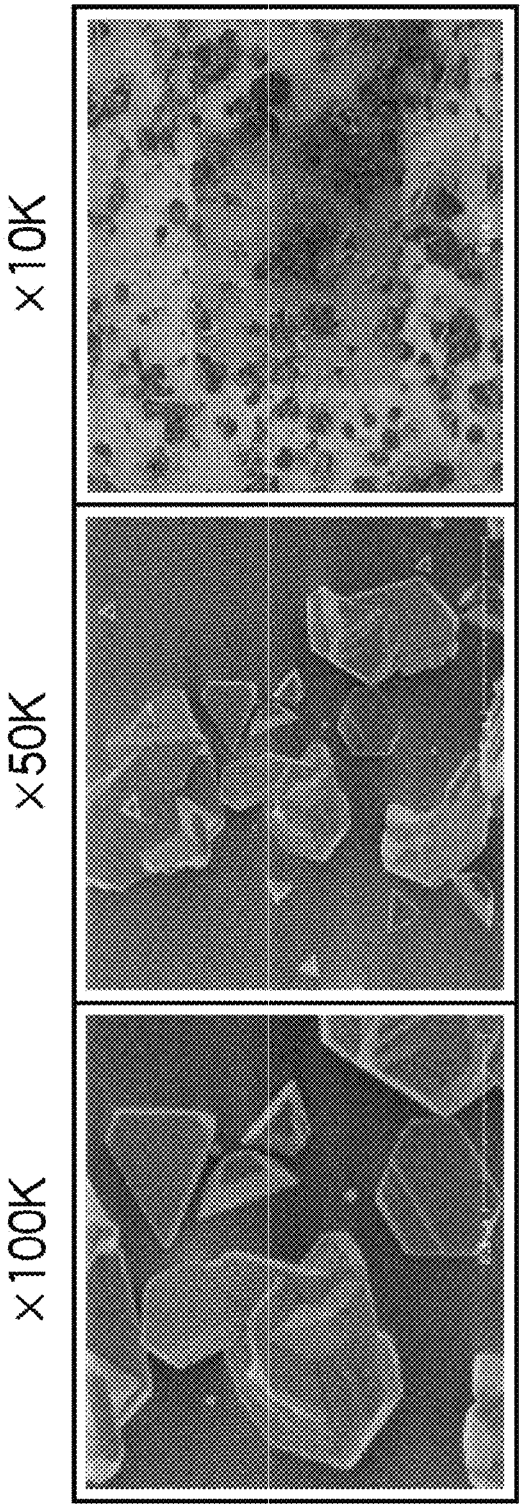
FIG. 3 is a scanning electron micrograph showing surface state of a film obtained by Experiment 1.

A measurement on a composition of the obtained film by an X-ray fluorescent (XRF) spectrometer shows that Ge/Sb/Te is about 22/26/53 (at %) and a film thickness measured by XRF is about 151 nm. A surface state of the film is shown in a scanning electron micrograph of FIG. 3. As shown in FIG. 3, grains having strong crystal habit are collected together sparsely. This indicates that a surface smoothness of the film is poor.

<Experiment 2>

A GeSb film is formed by the same apparatus condition and the same source materials as in Experiment 1 under the following conditions.

Mounting table temperature: 360° C.

Pressure within the processing chamber: 1213 Pa

Flow rate of Ge source material gas: 550 mL/min (sccm): $N_2$ standard

Flow rate of Sb carrier Ar gas: 20 mL/min (sccm)

Flow rate of Te carrier Ar gas: 0 mL/min (sccm)

Flow rate of dilution Ar gas: 500 mL/min (sccm)

Flow rate of backside Ar gas: 200 mL/min (sccm)

Film forming time: 240 sec

Figure 4:
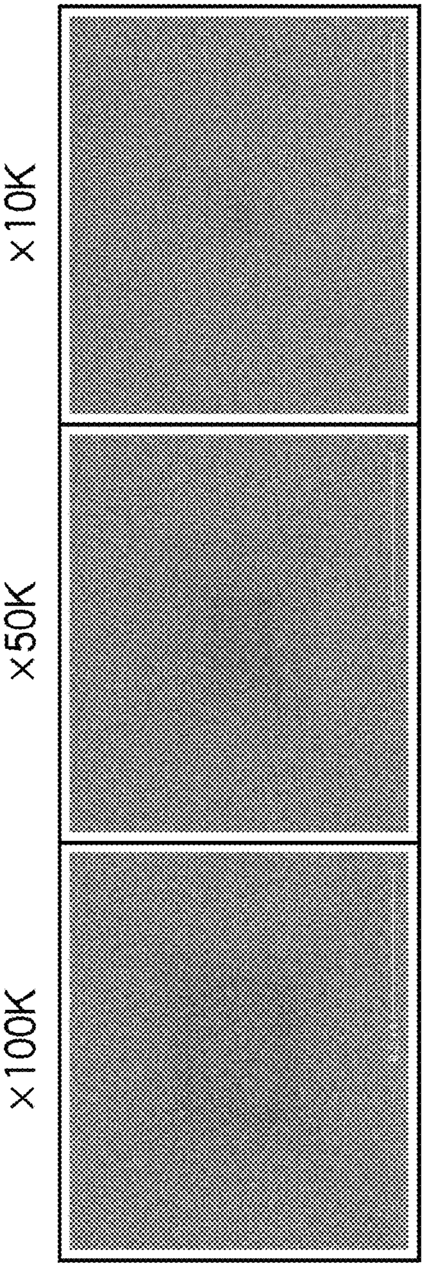
FIG. 4 is a scanning electron micrograph showing surface state of a film obtained by Experiment 2.

A measurement on a composition of the obtained film by an X-ray fluorescent (XRF) spectrometer shows that Ge/Sb/Te is about 61/39/0 (at %) and a film thickness measured by XRF is about 40 nm. As shown in a scanning electron micrograph (SEM) of FIG. 4, a surface state of the obtained film shows a good surface smoothness.

<Experiment 3>

A Ge—Sb—Te film is formed by performing a first stage process under the same conditions as in Experiment 2, and then by performing a second stage process in which only the Te source material is supplied under the following conditions.

Mounting table temperature: 360° C.

Pressure within the processing chamber: 1213 Pa

Flow rate of Ge source material gas: 0 mL/min (sccm)

Flow rate of Sb carrier Ar gas: 0 mL/min (sccm)

Flow rate of Te carrier Ar gas: 50 mL/min (sccm)

Flow rate of dilution Ar gas: 0 mL/min (sccm)

Flow rate of backside Ar gas: 200 mL/min (sccm)

Film forming time: 120 sec

Figure 5:
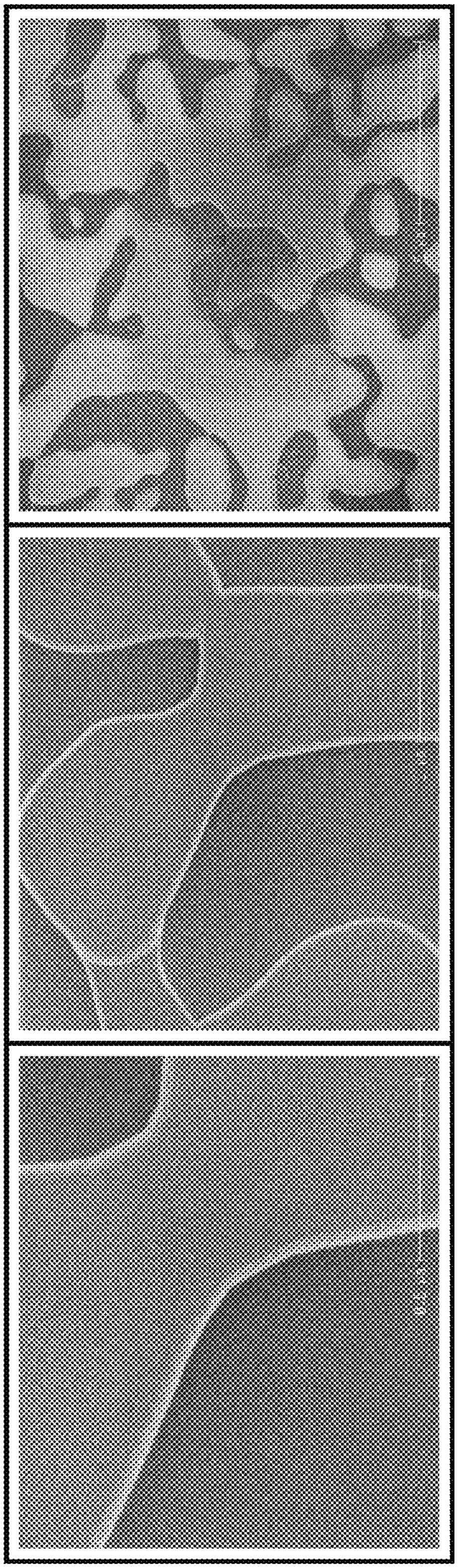
FIG. 5 is a scanning electron micrograph showing surface state of a film obtained by Experiment 3.

A measurement on a composition of the obtained film by an X-ray fluorescent (XRF) spectrometer shows that, Ge/Sb/Te is about 37/14/49 (at %), which is a similar case where a $Ge_{24}Sb_{25}$ film is omitted from the film obtained in Experiment 2 and is replaced with Te. Further, a film thickness measured by XRF is about 128 nm. A surface state of the film is shown in a scanning electron micrograph (SEM) of FIG. 5. As shown in FIG. 5, it looks like the film formed in Experiment 2 is etched to form a depletion having strong crystal habit. Further, the surface smoothness of the film is poor. The reason for this is considered to be because, if the Te source material supplied in the second stage reaches the film having the composition of Ge/Sb/Te=61/39/0 (at %) formed in the first stage, $Ge_2Sb_2Te_5$ having a low melting point and a high vapor pressure is formed to be removed into a gaseous state. That is, although the film in Experiment 3 is more similar to $Ge_2Sb_2Te_5$ than the film in Experiment 2 in view of the film composition, the surface smoothness is poor because the depletion having the strong crystal habit exists.

<Experiment 4>

A Ge—Sb—Te film is formed by performing a first stage process under the same conditions as in Experiment 2 except that the pressure within the processing chamber is set to be about 1173 Pa, and then performing a second stage process in which the Sb source material and the Te source material are supplied under the following conditions.

Mounting table temperature: 360° C.

Pressure within the processing chamber: 1173 Pa

Flow rate of Ge source material gas: 0 mL/min (sccm)

Flow rate of Sb carrier Ar gas: 20 mL/min (sccm)

Flow rate of Te carrier Ar gas: 50 mL/min (sccm)

Flow rate of dilution Ar gas: 500 mL/min (sccm)

Flow rate of backside Ar gas: 200 mL/min (sccm)

Film forming time: 30 sec

Figure 6:
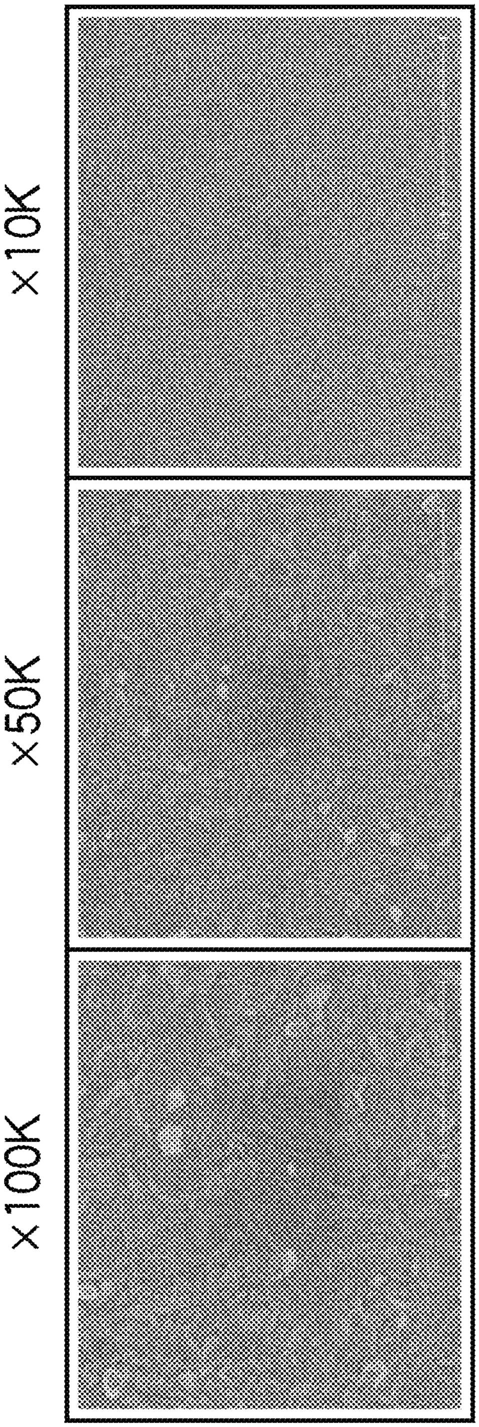
FIG. 6 is a scanning electron micrograph showing surface state of a film obtained by Experiment 4.

A measurement on a composition of the obtained film by an X-ray fluorescent (XRF) spectrometer shows that Ge/Sb/Te is about 26/26/48 (at %) and the composition thereof is similar to $Ge_2Sb_2Te_5$. Further, a film thickness measured by XRF is about 93 nm. As shown in a scanning electron micrograph (SEM) of FIG. 6, the surface smoothness of the film is good. In Experiment 4, although the first stage is the same as that in Experiment 3, the Sb source material gas is supplied in addition to the Te source material gas in the second stage, unlike in Experiment 3. Hence, it is proved that the etching by the Te source material gas as in Experiment 3 is suppressed. Therefore, a Ge—Sb—Te film having a composition similar to $Ge_2Sb_2Te_5$ and having a good surface smoothness can be formed.

<Experiment 5>

Here, a composition and a surface state of a film are inspected by varying a supply ratio of the Ge source material gas and the Sb source material gas in the first stage process. The mounting table temperature is set to be about 360° C.; the pressure within the processing chamber is set to be about 1213 Pa to about 1293 Pa; the flow rate of the dilution Ar gas is set to be about 500 mL/min (sccm); the flow rate of the backside Ar gas is set to be about 200 mL/min (sccm); and the flow rates of the Ge source material gas and the Sb carrier Ar gas are varied as in the following Nos. 1 to 7, respectively.

No. 1:

Flow rate of Ge source material gas: 800 mL/min (sccm): $N_2$ standard

Flow rate of Sb carrier Ar gas: 20 mL/min (sccm)

(Flow rate of Sb carrier Ar gas/flow rate of Ge source material gas)=0.025

Film forming time: 120 sec

No. 2 (Same as Experiment 2):

Flow rate of Ge source material gas: 550 mL/min (sccm): $N_2$ standard

Flow rate of Sb carrier Ar gas: 20 mL/min (sccm)

(Flow rate of Sb carrier Ar gas/flow rate of Ge source material gas)=0.036

Film forming time: 240 sec

No. 3:

Flow rate of Ge source material gas: 550 mL/min (sccm): $N_2$ standard

Flow rate of Sb carrier Ar gas: 30 mL/min (sccm)

(Flow rate of Sb carrier Ar gas/flow rate of Ge source material gas)=0.055

Film forming time: 180 sec

No. 4:

Flow rate of Ge source material gas: 550 mL/min (sccm): $N_2$ standard

Flow rate of Sb carrier Ar gas: 40 mL/min (sccm)

(Flow rate of Sb carrier Ar gas/flow rate of Ge source material gas)=0.072

Film forming time: 120 sec

No. 5:

Flow rate of Ge source material gas: 550 mL/min (sccm): $N_2$ standard

Flow rate of Sb carrier Ar gas: 100 mL/min (sccm)

(Flow rate of Sb carrier Ar gas/flow rate of Ge source material gas)=0.18

Film forming time: 240 sec

No. 6:

Flow rate of Ge source material gas: 200 mL/min (sccm): $N_2$ standard

Flow rate of Sb carrier Ar gas: 50 mL/min (sccm)

(Flow rate of Sb carrier Ar gas/flow rate of Ge source material gas)=0.25

Film forming time: 240 sec

No. 7:

Flow rate of Ge source material gas: 200 mL/min (sccm): $N_2$ standard

Flow rate of Sb carrier Ar gas: 100 mL/min (sccm)

(Flow rate of Sb carrier Ar gas/flow rate of Ge source material gas)=0.50

Film forming time: 240 sec

Compositions of films of Nos. 1 to 7 are measured by the X-ray fluorescent (XRF) spectrometer, and the following results are obtained.

No. 1: Ge/Sb/Te=62/38/0 (at %)

No. 2: Ge/Sb/Te=61/39/0 (at %)

No. 3: Ge/Sb/Te=55/40/5 (at %)

No. 4: Ge/Sb/Te=57/43/0 (at %)

No. 5: Ge/Sb/Te=48/45/7 (at %)

No. 6: Ge/Sb/Te=34.8/55.9/9.3 (at %)

No. 7: Ge/Sb/Te=27.7/62.0/10.3 (at %)

Figure 7:
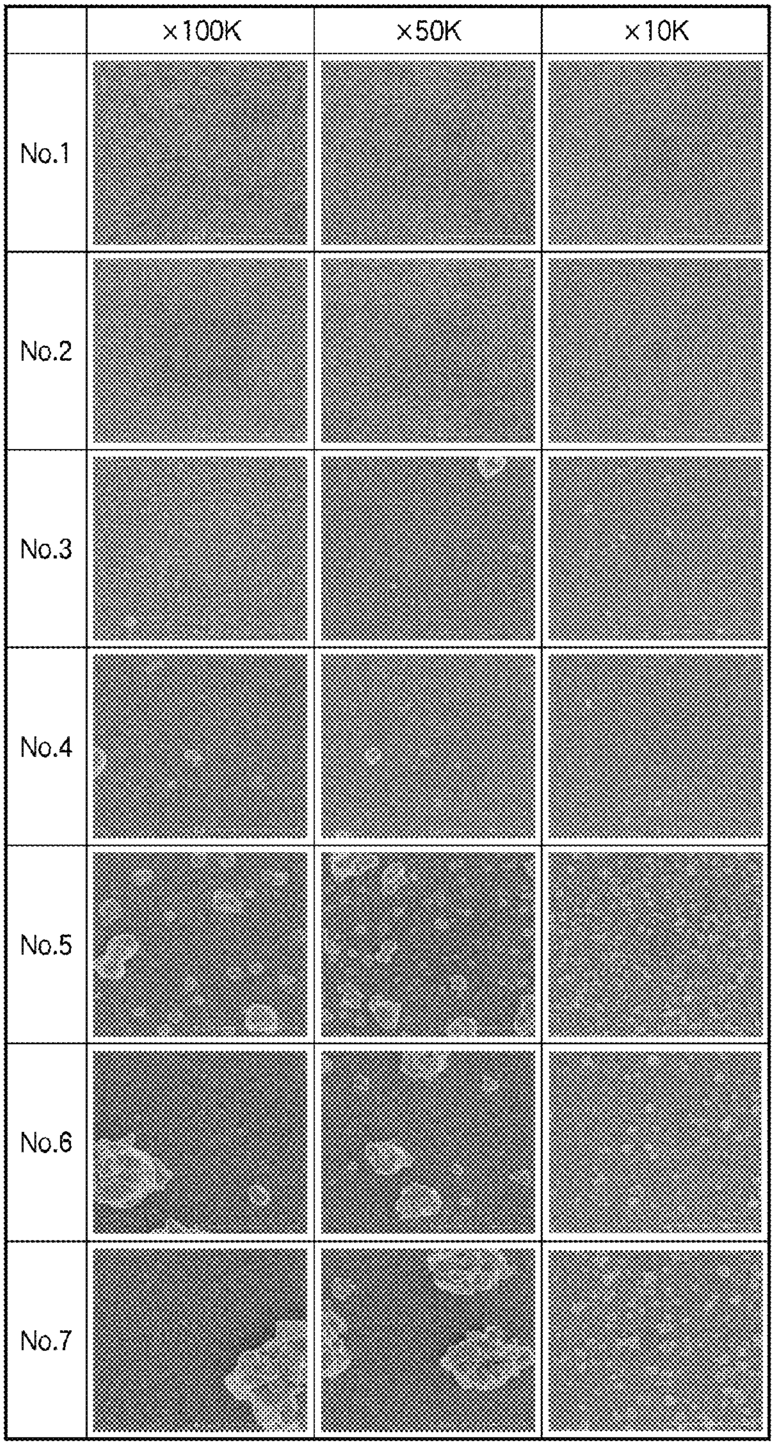
FIG. 7 presents scanning electron micrographs showing surface states of films formed by varying a composition ratio of Ge/Sb in a first stage in accordance with Experiment 5.

Further, surface states of the films of Nos. 1 to 7 are as shown in scanning electron micrographs (SEM) of FIG. 7. That is, the best surface smoothness is obtained in No. 2 in which the Sb content is about 39 at %. Surface smoothness is still good up to No. 4 in which the Sb content is about 43 at %. However, in Nos. 5 to 7 in which the amount of Sb is greater (a ratio of a flow rate of Sb carrier Ar gas/a flow rate of Ge source material>0.1), solidified particles are found on the surfaces of the films. As a result, it is found that the surface smoothness of the films is deteriorated to a certain degree.

Moreover, the present disclosure may not be limited to the above-described embodiment but can be modified in various ways. For example, in the film forming apparatus as described above, the substrate to be processed is heated by the lamp. However, the substrate to be processed can be heated by a resistance heater. Further, in the above-described embodiment, the Ge—Sb—Te film is applied to a phase-change film of a PRAM. However, the Ge—Sb—Te film can also be applied for another purpose, e.g., to a recording layer of a phase-change optical storage medium. Further, the substrate may not be limited to a semiconductor substrate and various kinds of substrates, e.g., a glass substrate, a resin substrate, etc., can also be used.

What is claimed is:

1. A method for forming a Ge—Sb—Te film having a composition of $Ge_2Sb_2Te_5$ on a substrate by a CVD method using a gaseous Ge source material, a gaseous Sb source material and a gaseous Te source material, the method comprising:

loading the substrate within a processing chamber;

performing a first stage film forming process to form a first film on the substrate by supplying the gaseous Ge source material and the gaseous Sb source material, or by supplying the gaseous Ge source material, the gaseous Sb source material and the gaseous Te source material, the gaseous Te source material being of such amount that $Ge_2Sb_2Te_5$ cannot be formed;

after performing the first stage film forming process, performing a second stage film forming process to form a second film on the first film by supplying the gaseous Sb source material and the gaseous Te source material, or by supplying the gaseous Sb source material, the gaseous Te source material and the gaseous Ge source material, the gaseous Ge source material being of such amount that $Ge_2Sb_2Te_5$ cannot be formed; and after performing the first stage film forming process only once and the second stage film forming process only once, unloading the substrate from the processing chamber, wherein the first film formed in the first stage film forming process and the second film formed in the second stage film forming process are unified during the second stage film forming process, so that the Ge—Sb—Te film having a smooth surface and having the composition of $Ge_2Sb_2Te_5$ is formed without generating crystals having strong crystal habit.

2. The method of claim 1, wherein when supplying the gaseous Te source material in the first stage film forming process, a flow rate of the gaseous Te source material is set such that a Te content of the film obtained through the first stage film forming process is less than about 10 at %.

3. The method of claim 1, wherein in the first stage film forming process, the gaseous Ge source material and the gaseous Sb source material are supplied such that a composition ratio Ge/Sb of the film obtained through the first stage film forming process is about 50/50 to about 70/30 based on an atom number ratio, or if a flow rate of the Ge source material is x (mL/min (sccm)) and a flow rate of a carrier Ar gas of the Sb source material is y (mL/min (sccm)), a ratio of y/x is about 0.01 to about 0.1.

4. The method of claim 1, wherein in the second stage film forming process, the gaseous Sb source material and the gaseous Te source material are supplied at a flow rate ratio capable of stably obtaining $Ge_2Sb_2Te_5$ by the first stage film forming process and the second stage film forming process.

5. The method of claim 1, wherein each of the Ge source material, the Sb source material and the Te source material includes a compound containing an alkyl group.

6. The method of claim 1, wherein the Ge—Sb—Te film has a smooth surface when viewed with a magnification of 10K or more.

7. The method of claim 1, wherein the gaseous Sb source material and the gaseous Te source material are supplied through bubbling into the processing chamber by flowing an inert gas, an amount of the gaseous Ge source material introduced into the processing chamber is controlled by a flow rate of the gaseous Ge source material, and an amount of the gaseous Sb source material introduced into the processing chamber and an amount of the gaseous Te source material introduced into the processing chamber are controlled by a flow rate of the inert gas.

8. The method of claim 1, wherein a temperature of a source material reservoir containing the gaseous Sb source material is set to be about 50° C., and a temperature of a source material reservoir containing the gaseous Ge source material is set to be about 35° C.

9. The method of claim 8, wherein a temperature of each pipeline from each mass flow controller and each source material reservoir to the processing chamber is maintained at about 160° C. by mantle heaters.

10. A method for manufacturing a PRAM by using the method of claim 1.

11. The method of claim 2, wherein in the first stage film forming process, the gaseous Ge source material and the gaseous Sb source material are supplied such that a composition ratio Ge/Sb of the film obtained through the first stage film forming process is about 50/50 to about 70/30 based on an atom number ratio, or if a flow rate of the Ge source material is x (mL/min (sccm)) and a flow rate of a carrier Ar gas of the Sb source material is y (mL/min (sccm)), a ratio of y/x is about 0.01 to about 0.1.

* * * * *

UNITED STATES PATENT AND TRADEMARK OFFICE

CERTIFICATE OF CORRECTION

PATENT NO. : 8,927,060 B2
APPLICATION NO. : 13/377199
DATED : January 6, 2015
INVENTOR(S) : Yumiko Kawano et al.

It is certified that error appears in the above-identified patent and that said Letters Patent is hereby corrected as shown below:

In the Specification,

Column 4, line 49, please add -- 21 -- between “source” and “into”

Column 4, line 65, please add -- 32 -- between “lamps” and “may”

Signed and Sealed this
Thirtieth Day of June, 2015

Michelle K. Lee

Michelle K. Lee
*Director of the United States Patent and Trademark Office*